(12) United States Patent
Akita et al.

(10) Patent No.: US 7,294,867 B2
(45) Date of Patent: Nov. 13, 2007

(54) SEMICONDUCTOR LIGHT GENERATING DEVICE

(75) Inventors: Katsushi Akita, Itami (JP); Takao Nakamura, Itami (JP); Hideki Hirayama, Wako (JP)

(73) Assignees: Sumitomo Electric Industries, Ltd., Osaka (JP); Riken, Saitama (JP)

( * ) Notice: Subject to any disclaimer, the term of this patent is extended or adjusted under 35 U.S.C. 154(b) by 118 days.

(21) Appl. No.: 11/032,230

(22) Filed: Jan. 11, 2005

(65) Prior Publication Data

US 2005/0151154 A1 Jul. 14, 2005

(30) Foreign Application Priority Data

Jan. 14, 2004 (JP) ............... P2004-007325

(51) Int. Cl.
*H01L 33/00* (2006.01)
*H01L 29/24* (2006.01)

(52) U.S. Cl. .......... 257/103; 257/101; 257/102; 257/E33.029

(58) Field of Classification Search .......... 257/103
See application file for complete search history.

(56) References Cited

U.S. PATENT DOCUMENTS 6,515,313 B1 * 2/2003 Ibbetson et al. ............ 257/103

| | | | |
|---|---|---|---|
| 7,012,283 B2 * | 3/2006 | Tsuda et al. | 257/103 |
| 2003/0116767 A1 * | 6/2003 | Kneissl et al. | 257/79 |
| 2005/0127391 A1 * | 6/2005 | Yanamoto | 257/103 |
| 2005/0135453 A1 * | 6/2005 | Kneissl et al. | 372/94 |

FOREIGN PATENT DOCUMENTS

JP 2001-119068 4/2001
JP 2001-237455 8/2001

OTHER PUBLICATIONS

Chinese Office Action, with English translation, issued in Chinese Patent Application No. CN 200510004321.X, mailed Jul. 6, 2007.

* cited by examiner

*Primary Examiner*—Tu-Tu Ho
(74) *Attorney, Agent, or Firm*—McDermott Will & Emery LLP

(57) ABSTRACT

The semiconductor light generating device comprises a light generating region 3, a first $Al_{X1}Ga_{1-X1}N$ semiconductor $(0 \leq X1 \leq 1)$ layer 5 and a second $Al_{X2}Ga_{1-X2}N$ semiconductor $(0 \leq X2 \leq 1)$ layer 7. In this semiconductor light generating device, the light generating region 3 is made of III-nitride semiconductor, and includes a InAlGaN semiconductor layer. The first $Al_{X1}Ga_{1-X1}N$ semiconductor $(0 \leq X1 \leq 1)$ layer 5 is doped with a p-type dopant, such as magnesium, and is provided on the light generating region 3. The second $Al_{X2}Ga_{1-X2}N$ semiconductor layer 7 has a p-type concentration smaller than the first $Al_{X1}Ga_{1-X1}N$ semiconductor layer 5. The second $Al_{X2}Ga_{1-X2}N$ semiconductor $(0 \leq X2 \leq 1)$ layer 7 is provided between the light generating region 3 and the first $Al_{X1}Ga_{1-X1}N$ semiconductor layer 5.

23 Claims, 11 Drawing Sheets

Fig.10
(A)
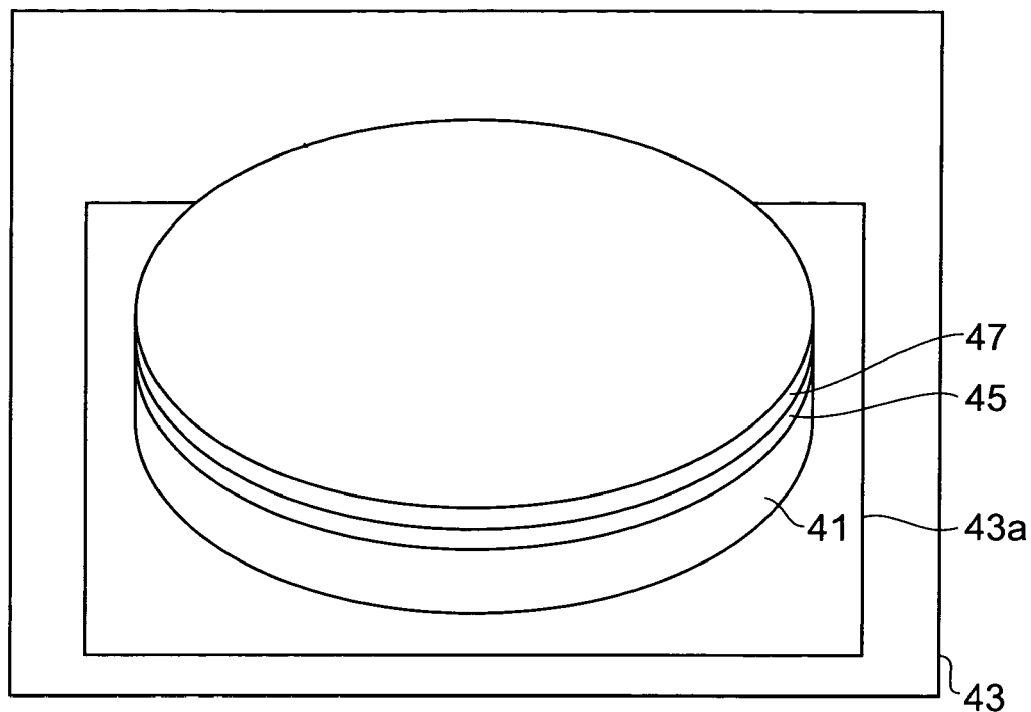
(B)
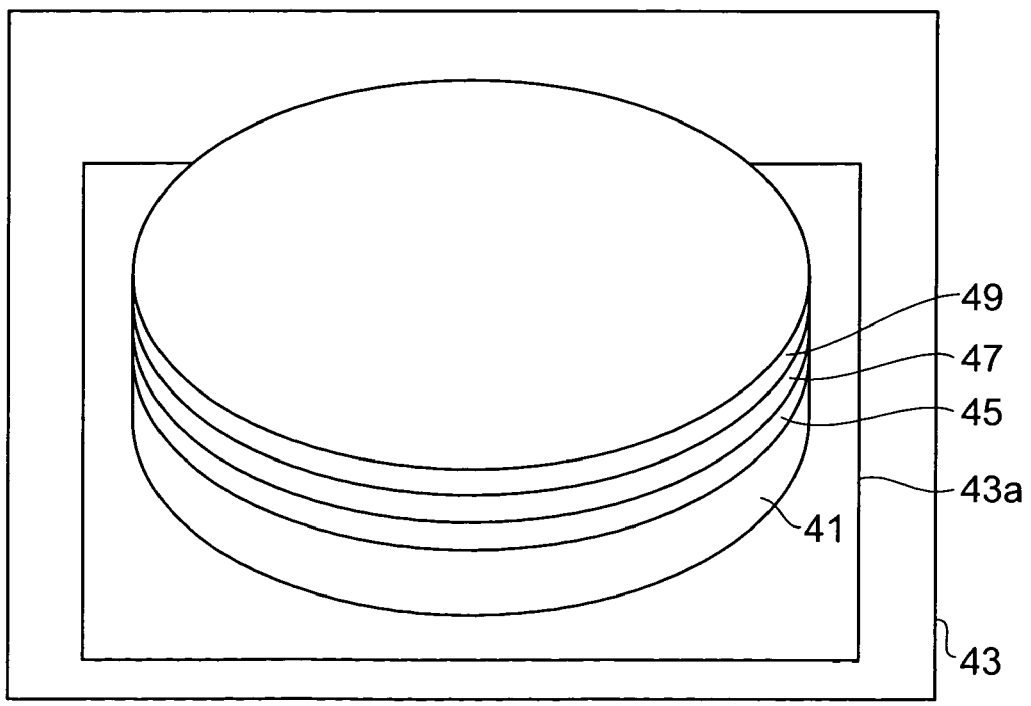

Fig.11
(A)
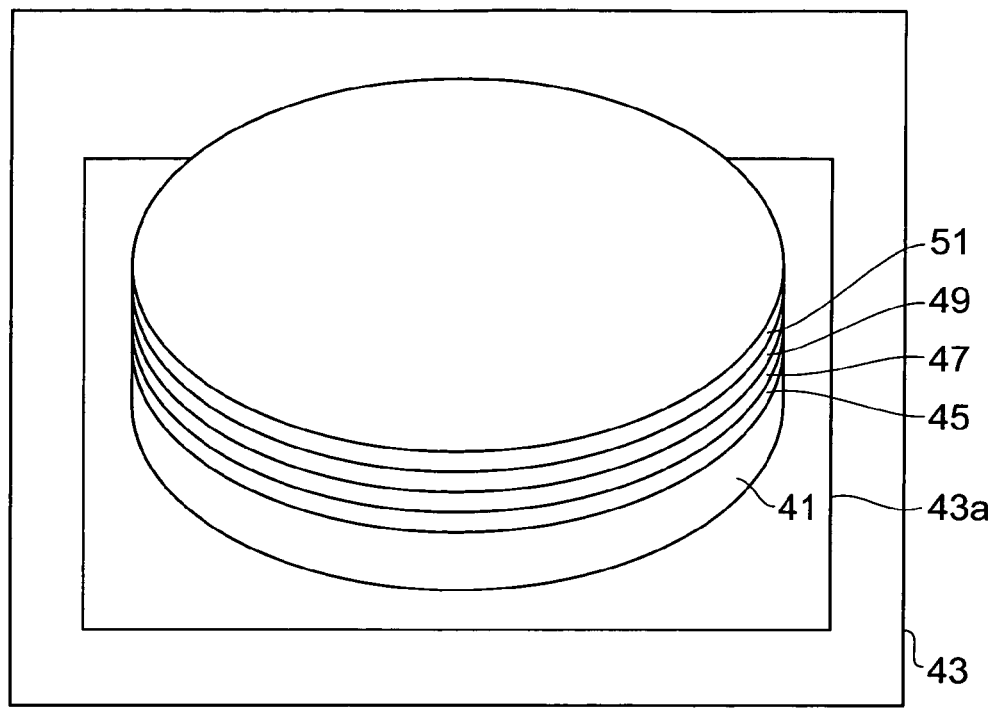
(B)
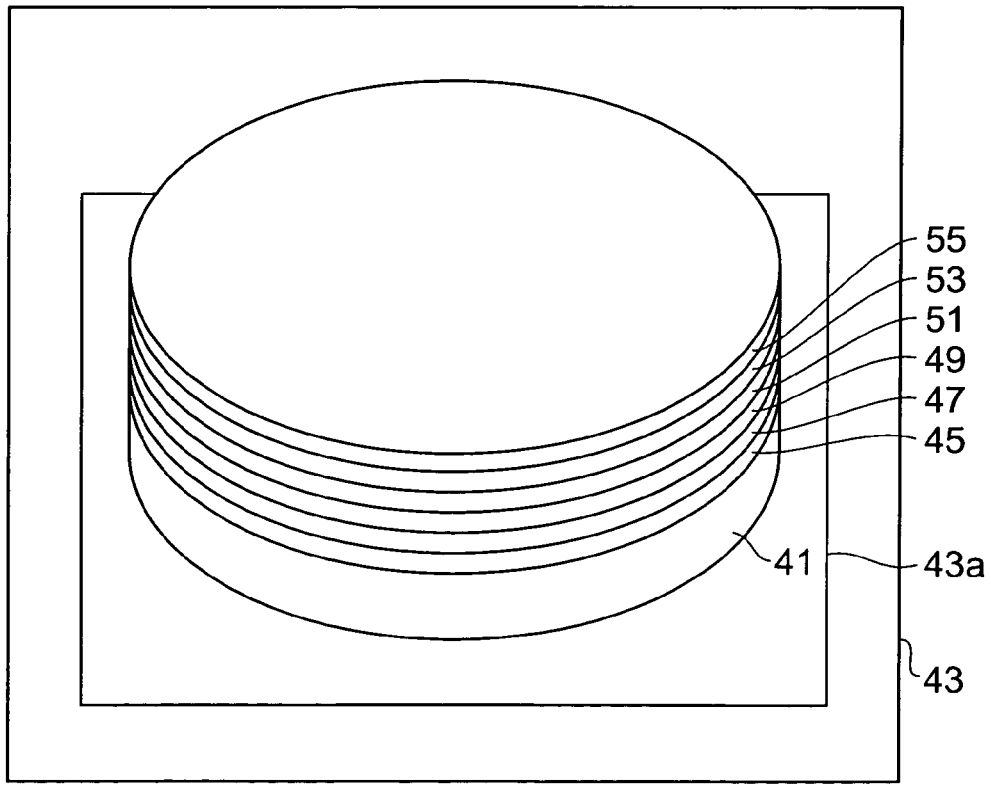

SEMICONDUCTOR LIGHT GENERATING DEVICE

BACKGROUND OF THE INVENTION

1. Field of the Invention

The present invention relates to a semiconductor light generating device and a method of the same.

2. Related Background of the Invention

Publication 1 (Japanese Patent Application Laid-Open No. 2001-237455) discloses an InAlGaN (indium aluminum gallium nitride) semiconductor material and an ultraviolet light generating device which uses the InAlGaN semiconductor and emits light in an ultraviolet wavelength region. This InAlGaN semiconductor light generating device can emit ultraviolet light at room temperature.

Publication 2 (Japanese Patent Application Laid-Open No. 2001-119068) discloses an ultraviolet light generating device. This ultraviolet light generating device has an undoped AlGaN cladding layer provided between an AlGaN active layer and a p-type AlGaN cladding layers and this undoped AlGaN cladding layer is not less than 10 nanometers. The undoped AlGaN cladding layer prevents electrons in the active layer from transiting to magnesium acceptor levels in the p-type AlGaN cladding layer. Using the undoped AlGaN cladding layer, the light generating device can use an sapphire substrate which is not expensive. In order to avoid the transition of electrons in the active layer to the Mg-doped AlGaN layer, the active layer has to be separated from the Mg-doped AlGaN layer and an undoped layer is needed between the active layer and the Mg-doped AlGaN layer.

SUMMARY OF THE INVENTION

The bandgap of the InAlGaN semiconductor can be widely varied depending on its composition. A semiconductor light generating device having InAlGaN light generating region can generate light of ultraviolet wavelength or more longer. In order to confine carriers to the light generating region in the semiconductor light generating device, a carrier blocking layer is formed therein and the carrier blocking layer is made of AlGaN semiconductor capable of providing a potential barrier greater than that of InAlGaN semiconductor.

The inventors' experiment has revealed that the light generating efficiency of the semiconductor light generating device is decreased due to p-type dopant atoms diffusing to a InAlGaN semiconductor layer in the active region from a p-type semiconductor region adjacent thereto It is an object of the present invention to provide a semiconductor light generating device the light generating efficiency of which is enhanced, and a method of making the same.

One aspect of the present invention is a method of making a semiconductor light generating device. The method comprises the steps of: (a) forming an undoped InAlGaN semiconductor film for an active region; (b) forming an undoped $Al_{X2}Ga_{1-X2}N$ semiconductor film ($0 \leq X2 \leq 1$) on the InAlGaN semiconductor film; and (c) forming a p-type $Al_{X1}Ga_{1-X1}N$ semiconductor film ($0 \leq X1 \leq 1$) and one or more gallium nitride based semiconductor films on the undoped $Al_{X2}Ga_{1-X2}N$ semiconductor film and causing p-type dopant atoms in the p-type $Al_{X1}Ga_{1-X1}N$ semiconductor film to diffuse to the undoped $Al_{X2}Ga_{1-X2}N$ semiconductor film.

In the above method, aluminum composition of the $Al_{X2}Ga_{1-X2}N$ semiconductor film is greater than that of the p-type $Al_{X1}Ga_{1-X1}N$ semiconductor film ($0 \leq X1 \leq 1$).

According to another aspect of the present invention, a semiconductor light generating device comprises (a) a light generating region including a InAlGaN semiconductor layer; (b) a first $Al_{X1}Ga_{1-X1}N$ semiconductor layer ($0 \leq X1 \leq 1$) doped with p-type dopant; and (c) a second $Al_{X2}Ga_{1-X2}N$ semiconductor layer ($0 \leq X2 \leq 1$) having a p-type dopant concentration smaller than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer.

In the semiconductor light generating device, the second $Al_{X2}Ga_{1-X2}N$ semiconductor layer includes a region having a p-type concentration of $3 \times 10^{18}$ cm$^{-3}$ or lower, and this region is 1 nanometer or more.

According to still another aspect of the present invention, a semiconductor light generating device comprises: (a) a light generating region including a InAlGaN semiconductor layer; (b) a first $Al_{X1}Ga_{1-X1}N$ semiconductor layer ($0 \leq X1 \leq 1$) doped with p-type dopant; and (c) a second $Al_{X2}Ga_{1-X2}N$ semiconductor layer ($0 \leq X2 \leq 1$) having an aluminum composition greater than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer, and the p-type dopant concentration of the second $Al_{X2}Ga_{1-X2}N$ semiconductor layer being smaller than that of the first $Al_{X1}Ga_{1-X1}N$ semiconductor layer.

In the semiconductor light generating device, thickness of the second $Al_{X2}Ga_{1-X2}N$ semiconductor layer is greater than or equal to five nanometers.

In the semiconductor light generating device, the first $Al_{X1}Ga_{1-X1}N$ semiconductor layer is doped with magnesium of p-type dopant, and the first $Al_{X1}Ga_{1-X1}N$ semiconductor layer includes a region having a magnesium concentration of $1 \times 10^{19}$ cm$^{-3}$ or higher.

In the semiconductor light generating device, the second $Al_{X2}Ga_{1-X2}N$ semiconductor layer is doped with magnesium dopant, and a p-type dopant concentration at an interface between the light generating region and the second $Al_{X2}Ga_{1-X2}N$ semiconductor layer is less than $3 \times 10^{18}$ cm$^{-3}$ or lower.

In the semiconductor light generating device, a maximum concentration of p-type dopant in the first $Al_{X1}Ga_{1-X1}N$ semiconductor layer is not less than $1 \times 10^{20}$ cm$^{-3}$, and a p-type dopant concentration at an interface between the light generating region and the second $Al_{X2}Ga_{1-X2}N$ semiconductor layer is not greater than $3 \times 10^{18}$ cm$^{-3}$.

The semiconductor light generating device, further comprises a supporting body of III-group nitride, the light generating region, the first $Al_{X1}Ga_{1-X1}N$ semiconductor layer and the second $Al_{X2}Ga_{1-X2}N$ semiconductor layer being provided on the supporting body.

In the above semiconductor light generating device, the second $Al_{X2}Ga_{1-X2}N$ semiconductor layer is formed as an undoped layer.

In the semiconductor light generating device, the second $Al_{X2}Ga_{1-X2}N$ semiconductor layer ($0 \leq X2 \leq 1$) has an aluminum composition greater than that of the first $Al_{X1}Ga_{1-X1}N$ semiconductor layer.

In the semiconductor light generating device, the light generating region further includes one or more InAlGaN semiconductor barrier layers and one or more InAlGaN semiconductor well layers.

The light generating semiconductor device includes a lightly doped semiconductor region on the light generating region and a semiconductor region of a low resistance in the second AlGaN semiconductor layer formed by doping it with dopant atoms diffusing from the first AlGaN semiconductor layer.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 10(A) through 10(B) is are views explaining steps in a method of making a semiconductor light generating device;

FIGS. 11 (A) through 11 (B) is are views explaining steps in a method of making a semiconductor light generating device.

DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of the semiconductor light generating device according to the present invention will now be explained. When possible, parts identical to each other will be referred to with numerals identical to each other.

First Embodiment

Figure 1:
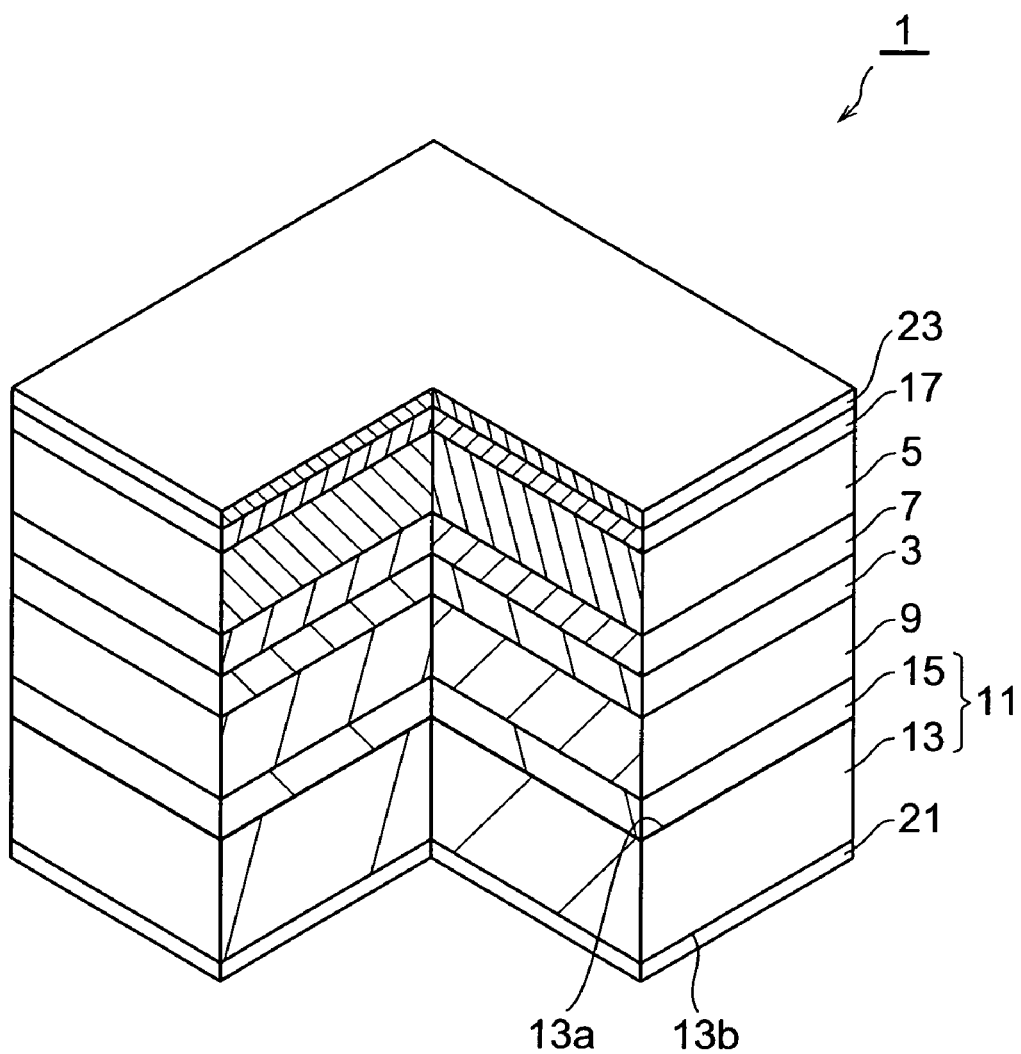
FIG. 1 is a perspective view showing a semiconductor light generating device according to the present embodiment.

FIG. 1 shows a semiconductor light generating device according to the first embodiment. This semiconductor light generating device has a structure preferable to a surface emitting device such as a light emitting diode.

The semiconductor light generating device comprises a light generating region 3, a first $Al_{X1}Ga_{1-X1}N$ semiconductor ($0 \leq X1 \leq 1$) layer 5 and a second $Al_{X2}Ga_{1-X2}N$ semiconductor ($0 \leq X2 \leq 1$) layer 7. In this semiconductor light generating device 1, the light generating region 3 is made of III-group nitride semiconductor, and includes a InAlGaN semiconductor layer. The first $Al_{X1}Ga_{1-X1}N$ semiconductor ($0 \leq X1 \leq 1$) layer 5 is doped with a p-type dopant, such as magnesium, and is provided on the light generating region 3. The second $Al_{X2}Ga_{1-X2}N$ semiconductor ($0 \leq X2 \leq 1$) layer 7 is provided between the light generating region 3 and the first $Al_{X1}Ga_{1-X1}N$ semiconductor layer 5. The second $Al_{X2}Ga_{1-X2}N$ semiconductor layer 7 has a p-type dopant concentration smaller than that of the first $Al_{X1}Ga_{1-X1}N$ semiconductor layer 5.

Since the second $Al_{X2}Ga_{1-X2}N$ semiconductor layer 7 separates the light generating region 3 from the first $Al_{X1}Ga_{1-X1}N$ semiconductor layer 5, p-type dopant atoms in the first $Al_{X1}Ga_{1-X1}N$ semiconductor layer 5 diffuse into the second $Al_{X2}Ga_{1-X2}N$ semiconductor layer 7 in the fabrication process. The second $Al_{X2}Ga_{1-X2}N$ semiconductor layer 7 lowers the number of p-type dopant atoms which diffuse from the first $Al_{X1}Ga_{1-X1}N$ semiconductor layer 5 to the light generating region 3, thereby enhancing the light generating efficiency of the semiconductor light generating device.

There are a number of pits on the surface of InAlGaN semiconductor layer. These pits are located in the high threading dislocation region. If an AlGaN semiconductor layer doped relatively heavily is deposited on the InAlGaN semiconductor layer, p-type dopant atoms in this p-type AlGaN layer diffuse to the light generating region by the aid of the pits. On the other side, since an AlGaN semiconductor layer having a relatively low carriers concentration is provided on the InAlGaN semiconductor layer instead of not a heavily doped AlGaN semiconductor layer, the number of the atoms diffusing to the InAlGaN layer is reduced. A semiconductor region having a low carrier concentration is formed just on the second $Al_{X2}Ga_{1-X2}N$ semiconductor layer 7 and the light generating region includes a semiconductor region the resistance of which is lowered by dopant atoms from the first $Al_{X1}Ga_{1-X1}N$ semiconductor layer 5.

The light generating device 1 includes a third $Al_{X3}Ga_{1-X3}N$ semiconductor ($0 \leq X3 \leq 1$) layer 9. The third $Al_{X3}Ga_{1-X3}N$ semiconductor layer 9 is doped with n-type dopant, such as silicon. In an example, the light generating region 3 is formed on the third $Al_{X3}Ga_{1-X3}N$ semiconductor layer 9. The light generating region 3 is provided between the first $Al_{X1}Ga_{1-X1}N$ semiconductor layer 5 and the third $Al_{X3}Ga_{1-X3}N$ semiconductor layer 9.

The third $Al_{X3}Ga_{1-X3}N$ semiconductor layer 9 supplies electrons to the light generating region 3 and the first $Al_{X1}Ga_{1-X1}N$ semiconductor layer 5 supplies holes to the light generating region 3 through the second $Al_{X2}Ga_{1-X2}N$ semiconductor layer 7. These carriers (electrons and holes) are confined into the light generating region 3 due to the two AlGaN semiconductor layers and the recombination of the carriers generates light in the light generating region.

The light generating device 1 includes a supporting body 11. The supporting body 11 mounts the first to third AlGaN layers 5, 7, 9 and the light generating region 3 on its primary surface. In a preferred example, the supporting body 11 may be a III-group nitride supporting body 13, and the supporting body 11 can includes a buffer layer 15 provided on the primary surface of the III-group nitride supporting body 13. The III-group nitride supporting body 13 may be made of gallium nitride (GaN), aluminum nitride (AlN) and so on, and the following can be used as material for the supporting body: silicon carbide (SiC) and zirconium di-boride ($ZrB_2$).

In a preferred example, the supporting body 11 may be made of gallium nitride. This gallium nitride supporting body has a low density of threading dislocations which are formed in the light generating region 3 and which act as non-radiative recombination centers.

The light generating device 1 includes a contact layer 17. The contact layer 17 is provided on the AlGaN semiconductor layer 5. The semiconductor light generating device 1 further includes a cathode electrode 21 provide on the backside of the supporting body and an anode electrode 23 provided on the contact layer 17.

Figure 2:
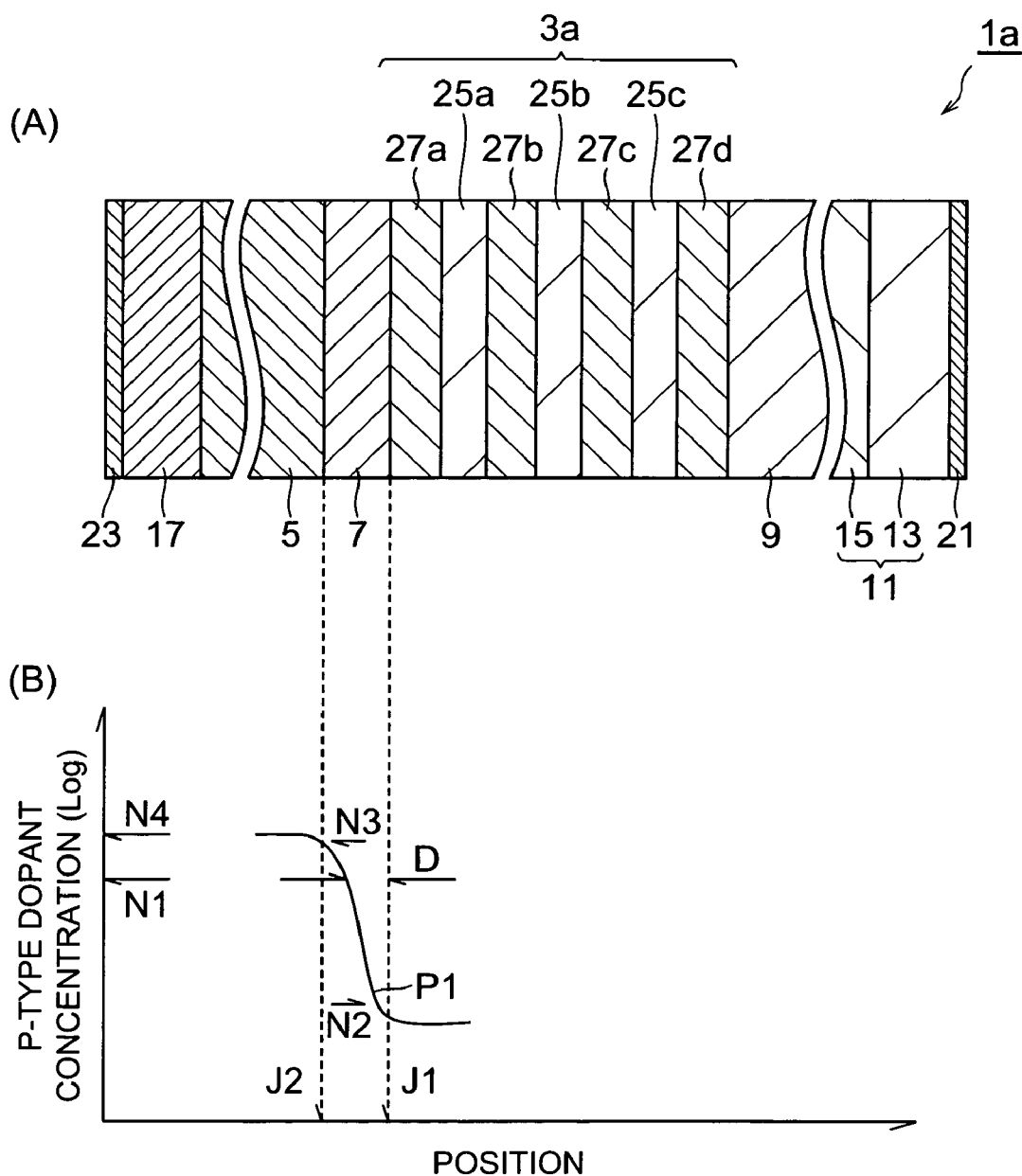
FIG. 2(A) through 2(B) is a view showing a modified semiconductor light generating device.

Area (A) in FIG. 2 shows a modified semiconductor light generating device. Area (B) in FIG. 2 shows a p-type dopant profile. The modified semiconductor light generating device 1a has a light generating region 3a in place of the light generating region 3. The light generating region 3a has one or more well layers (for example, well layer 25a, 25b, 25c) and a plurality of barriers layers (for example, barrier layers 27a, 27b, 27c, 27d). The well layer 25a, 25b, 25c and the barriers layers 27a, 27b, 27c, 27d are arranged alternately. Each of the barriers layers 27a, 27b, 27c, 27d has a potential barrier to the well layer 25a, 25b, 25c. The light generating region 3a are located between the two AlGaN semiconductor regions and these AlGaN semiconductor regions have potential barriers to the barrier layers 27a, 27e, respectively. The light generating region 3a has a MQW structure, but subsequent explanation may apply to single quantum well (SQW) structures as well.

Referring to area (B) in FIG. 2, a curve indicating a p-type dopant concentration is shown as a function of the coordinate. In the subsequent explanation, a p-type dopant profile is explained with reference to AlGaN layers each containing magnesium atoms as a p-type dopant. Profile P1 indicates the magnesium dopant concentration and monotonically decreases from the first AlGaN semiconductor layer to the light generating region 3.

In a preferred example, the magnesium concentration of the first AlGaN semiconductor layer 5 is greater than $1 \times 10^{19}$ cm$^{-3}$ (indicated by Arrow N1). This heavy doping in the semiconductor light generating device 1a prevents the resistance of the first Al$_{X1}$Ga$_{1-X1}$N semiconductor layer 5 from increasing even when a portion of the magnesium atoms diffuse from the first AlGaN semiconductor layer 5 to the second AlGaN semiconductor layer 7.

In a preferred example for the semiconductor light generating device 1a, the magnesium concentration at the interface (indicated by Arrow J1) between the light generating 3a and the second AlGaN semiconductor layer 7 is smaller than $3 \times 10^{18}$ cm$^{-3}$ (indicated by Arrow N2). This second AlGaN semiconductor layer 7 is effective in avoiding the increase of the p-type dopant concentration in the light generating region 3.

In a preferred example, the magnesium concentration at the interface (indicated by Arrow J2) between the first AlGaN semiconductor layer 5 and the second AlGaN semiconductor layer 7 is larger than $1 \times 10^{19}$ cm$^{-3}$ (indicated by Arrow N3). This first AlGaN semiconductor layer 5 prevents the p-type dopant concentration in the light generating region 3 from increasing to such a extent that the light generating efficiency of the semiconductor light generating device 1a is deteriorated.

Additionally, in a preferred example, the maximum magnesium concentration of the first AlGaN semiconductor layer 5 is not less than $1 \times 10^{20}$ cm$^{-3}$ (indicated by Arrow N4). This light generating device 1a, the resistance of the first AlGaN semiconductor layer 5 still remains low.

The light generating device 1a includes a region which is provided between the first AlGaN semiconductor layer 5 and the light generating region 3 and which has a p-type dopant concentration not greater than $3 \times 10^{18}$ cm$^{-3}$. The thickness D is not less than one nanometer. If the thickness falls within this range, the light generating region is separated sufficiently from the first AlGaN semiconductor layer 5 to lower the p-type dopant concentration in the light generating region.

In a preferred example, a part contributing to the light generation in the light generating region has a magnesium concentration of $1 \times 10^{17}$ cm$^{-3}$ or less.

In a preferred example, the thickness of the second AlGaN semiconductor layer 7 is not less than one nanometer in the semiconductor light generating device 1a. If this thickness falls within the range, the light generating region 3a is separated sufficiently from the first AlGaN semiconductor layer 5. The layered AlGaN semiconductor region adjacent to the light generating region 3a has a magnesium concentration of not more than $1 \times 10^{17}$ cm$^{-3}$. If this concentration falls within the range, the magnesium concentration in the light generating region 3a becomes sufficiently low.

In a preferred example, the thickness of the second Al$_{X2}$Ga$_{1-X2}$N semiconductor layer is not more than 50 nanometers. If this thickness falls within the above range, the efficiency of the carrier injection to light generating region 3a is in an acceptable range.

Since the second Al$_{X2}$Ga$_{1-X2}$N semiconductor layer is formed as an undoped semiconductor layer, a p-type dopant concentration at the interface between the second Al$_{X2}$Ga$_{1-X2}$N semiconductor layer and the light generating region is smaller than an n-type dopant concentration at the interface between the third Al$_{X3}$Ga$_{1-X3}$N semiconductor layer and the light generating region.

Figure 3:
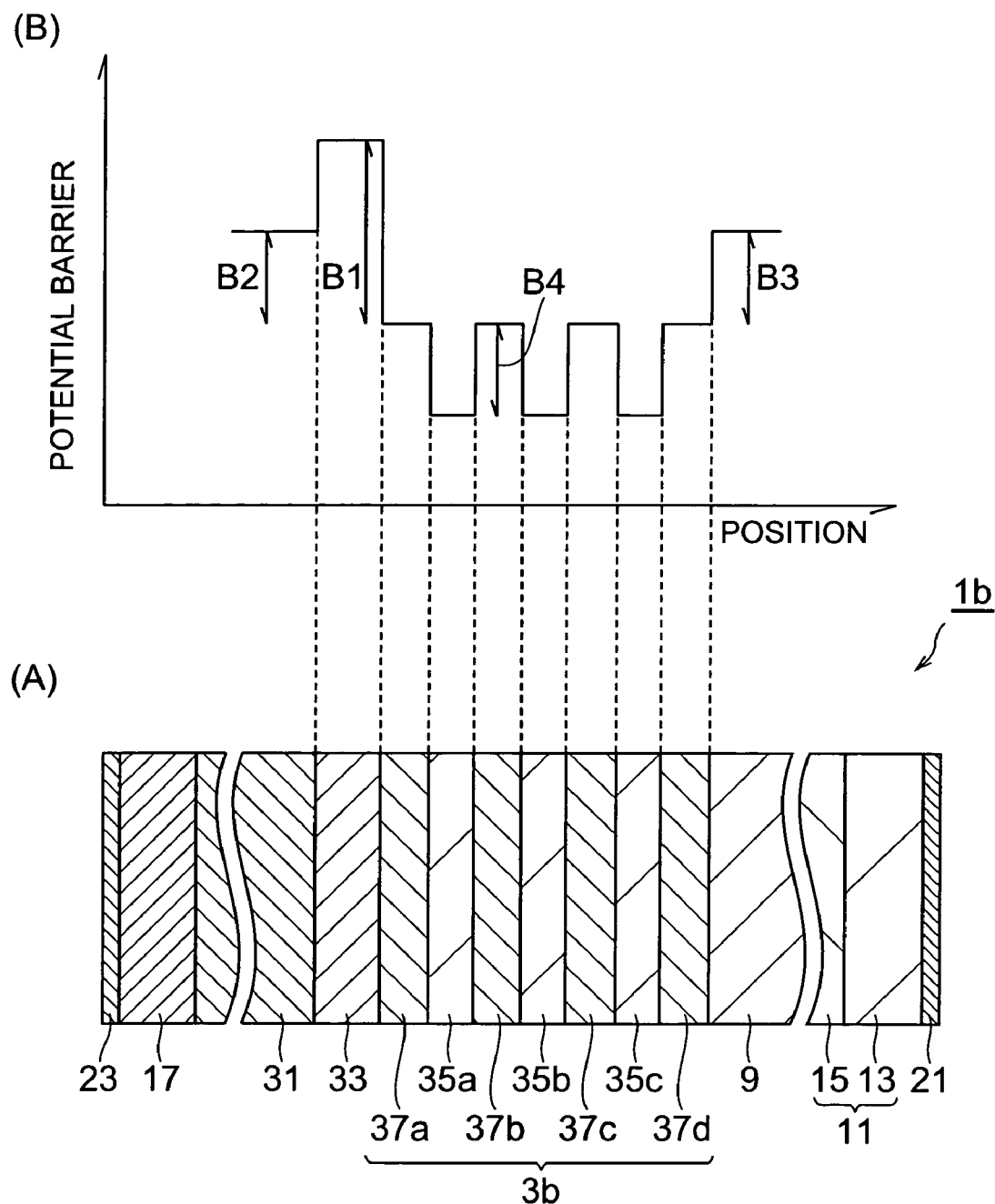
FIG. 3(A) through 3(B) is a view showing a modified semiconductor light generating device.

Area (A) in FIG. 3 shows a modified semiconductor light generating device. Area (B) in FIG. 3 is a diagram showing potential barrier in this semiconductor light generating device.

The semiconductor light generating device 1b comprises a light generating region 3b, a first Al$_{X1}$Ga$_{1-X1}$N semiconductor layer ($0 \leq X1 \leq 1$) 31 and a second Al$_{X2}$Ga$_{1-X2}$N semiconductor layer ($0 \leq X2 \leq 1$) 33. In this semiconductor light generating device 1b, the light generating region 3b is made of III-group nitride semiconductor and includes an InAlGaN semiconductor layer. The second Al$_{X2}$Ga$_{1-X2}$N semiconductor layer 33 has a p-type concentration smaller than that of the first Al$_{X1}$Ga$_{1-X1}$N semiconductor layer 31. The second Al$_{X2}$Ga$_{1-X2}$N semiconductor layer 33 is provided between the light generating region 3b and the first Al$_{X1}$Ga$_{1-X1}$N semiconductor layer 31.

Since the second Al$_{X2}$Ga$_{1-X2}$N semiconductor layer 33 is provided between the InAlGaN semiconductor layer and the first Al$_{X1}$Ga$_{1-X1}$N semiconductor layer 31, the p-type dopant atoms in the first Al$_{X1}$Ga$_{1-X1}$N semiconductor layer 31 diffuse in the manufacturing process. The second Al$_{X2}$Ga$_{1-X2}$N semiconductor layer 33 is effective in reducing the number of p-type dopant atoms diffusing from the first Al$_{X1}$Ga$_{1-X1}$N semiconductor layer 31 to the light generating device 3b. Therefore, the light generating efficiency of the light generating device 1b is improved.

If the aluminum composition in AlGaN semiconductor is increased, carrier confinement to the light generating region including InAlGaN semiconductor layer is enhanced. But, the accepter level becomes deeper as the aluminum composition of AlGaN is larger. Consequently, the activation rate of the p-type dopant is lowered. In the semiconductor light generating device 1b, the aluminum composition of the second Al$_{X2}$Ga$_{1-X2}$N semiconductor layer 33 is larger than that of the first Al$_{X1}$Ga$_{1-X1}$N semiconductor layer 31. P-type dopant atoms of the first Al$_{X1}$Ga$_{1-X1}$N semiconductor layer 31 can be easily activated as compared to the second Al$_{X2}$Ga$_{1-X2}$N semiconductor layer 33. Since the potential barrier of the second Al$_{X2}$Ga$_{1-X2}$N semiconductor layer 33 to the light generating region 3b is larger than that of the first $Al_{X1}Ga_{1-X1}N$ semiconductor layer 31, these AlGaN semiconductor layers as a whole confine carriers tightly. In a preferred example, the thickness of the second $Al_{X2}Ga_{1-X2}N$ semiconductor layer 33 is not less than five nanometers. If the thickness falls within the above range, the light generating region 3b is sufficiently separated from the first $Al_{X1}Ga_{1-X1}N$ semiconductor layer 31 and the carrier confinement is improved. In a preferred example, the thickness of the second $Al_{X2}Ga_{1-X2}N$ semiconductor layer 33 is not more than 50 nanometers. This second $Al_{X2}Ga_{1-X2}N$ semiconductor layer 33 permits the carrier confinement efficiency to be in an acceptable range.

The light generating region 3b has one or more well layers (for example, well layers 35a, 35b, 35c) and a plurality of barrier layers (for example, barrier layers 37a, 37b, 37c, 37d). The well layers 35a to 35c and the barrier layers 37a to 37d are alternately arranged. As shown in area (B) in FIG. 3, the light generating layer 3b is located between the two AlGaN semiconductor layers, and potential barrier greater B1 of the second $Al_{X2}Ga_{1-X2}N$ semiconductor layer 33 to the barrier 37a is greater than the potential barrier B2 of the first AlGaN semiconductor layer 32. The third AlGaN semiconductor layer 9 provides potential barrier B3 to the barrier 37d. The barrier layers 37a, 37b, 37c, 37d provide potential barrier B4 to the well layers 35a, 35b, 35c.

In a preferred example of the light generating region 3a and 3b, the $In_{Y1}Al_{Z1}Ga_{1-Y1-Z1}N$ well layer satisfies the following: $0 \leq Y1 \leq 0.2$; $0 \leq Z1 \leq 0.5$. The $In_{Y2}Al_{Z2}Ga_{1-Y2-Z2}N$ well layer satisfies the following: $0 \leq Y2 \leq 0.2$; $0 \leq Z2 \leq 0.5$. The bandgap of the $In_{Y1}Al_{Z1}Ga_{1-Y1-Z1}N$ is smaller than the $In_{Y2}Al_{Z2}Ga_{1-Y2-Z2}N$.

Items of light emitting diode A is listed as a preferred example of the semiconductor light generating device:

contact layer 17: Mg doped GaN semiconductor
  50 nanometers first AlGaN semiconductor layer 5: Mg doped $Al_{0.18}Ga_{0.82}N$ semiconductor
  50 nanometers second AlGaN semiconductor layer 33: Mg doped $Al_{0.27}Ga_{0.73}N$ semiconductor (formed as an undoped semiconductor layer)
  20 nanometers light generating region 3b:

well layers 35a to 35c: InAlGaN semiconductor
  15 nanometers barrier layers 37a to 37d: InAlGaN semiconductor
  3 nanometers third AlGaN semiconductor layer 9: Si doped $Al_{0.18}Ga_{0.82}N$ semiconductor
  0.2 micrometers buffer layer 15: Si doped GaN semiconductor
  0.1 micrometers supporting body 13: GaN substrate.

Figure 4:
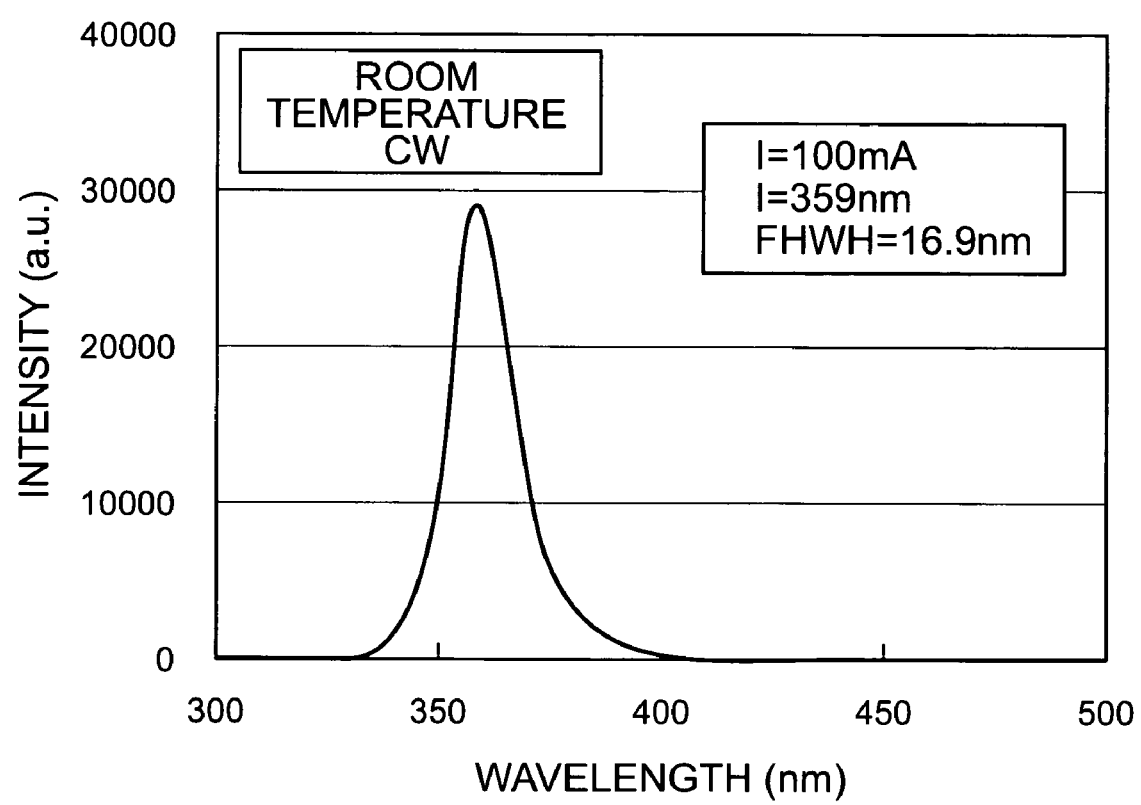
FIG. 4 is a graph showing a optical spectrum of a light emitting diode shown in an example.

FIG. 4 is a graph showing light generating characteristics of the above light emitting diode. The horizontal axis indicates wavelength in nanometer, and the vertical axis indicates relative optical power intensity. The characteristic curve shows an optical spectrum of the light emitting diode to which 100 mA is continuously fed and the light generation is caused by the band to band transition in InAlGaN semiconductor. Its peak wavelength is 359 nanometers, which is in ultraviolet wavelength region and its half maximum half-width is 16.9 nanometers.

Figure 5:
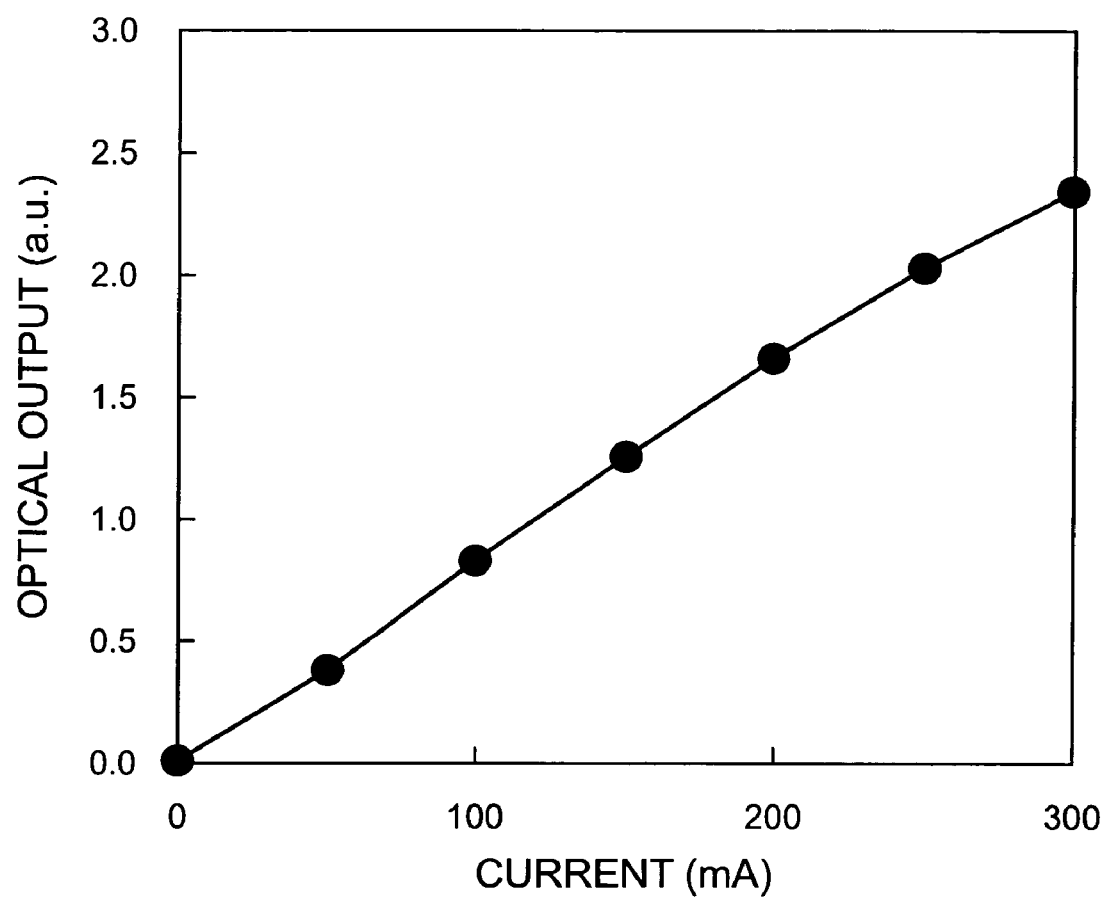
FIG. 5 is a graph showing a optical power of a light emitting diode shown in an example.

FIG. 5 shows a graph showing optical power characteristics of the above light emitting diode. The horizontal axis indicates applied current in mA, and the vertical axis indicates optical power in mW. The optical power is monotonically increased up to 300 mA as the applied current is increased, and the optical power is direct proportional to the applied current.

In order to explain the technical contribution of the second AlGaN semiconductor layer, light emitting diode B has been prepared. Items of light emitting diode B is listed as a preferred example of the semiconductor light generating device:

contact layer: Mg doped GaN semiconductor
  50 nanometers first AlGaN semiconductor layer: Mg doped $Al_{0.18}Ga_{0.82}N$ semiconductor
  50 nanometers second AlGaN semiconductor layer: Mg doped $Al_{0.27}Ga_{0.73}N$ semiconductor
  20 nanometers light generating region:

well layers: InAlGaN semiconductor
  15 nanometers barrier layers: InAlGaN semiconductor
  3 nanometers third AlGaN semiconductor layer: Si doped $Al_{0.18}Ga_{0.82}N$ semiconductor
  0.2 micrometers buffer layer: Si doped GaN semiconductor
  0.1 micrometers supporting body: GaN substrate.

Figure 6:
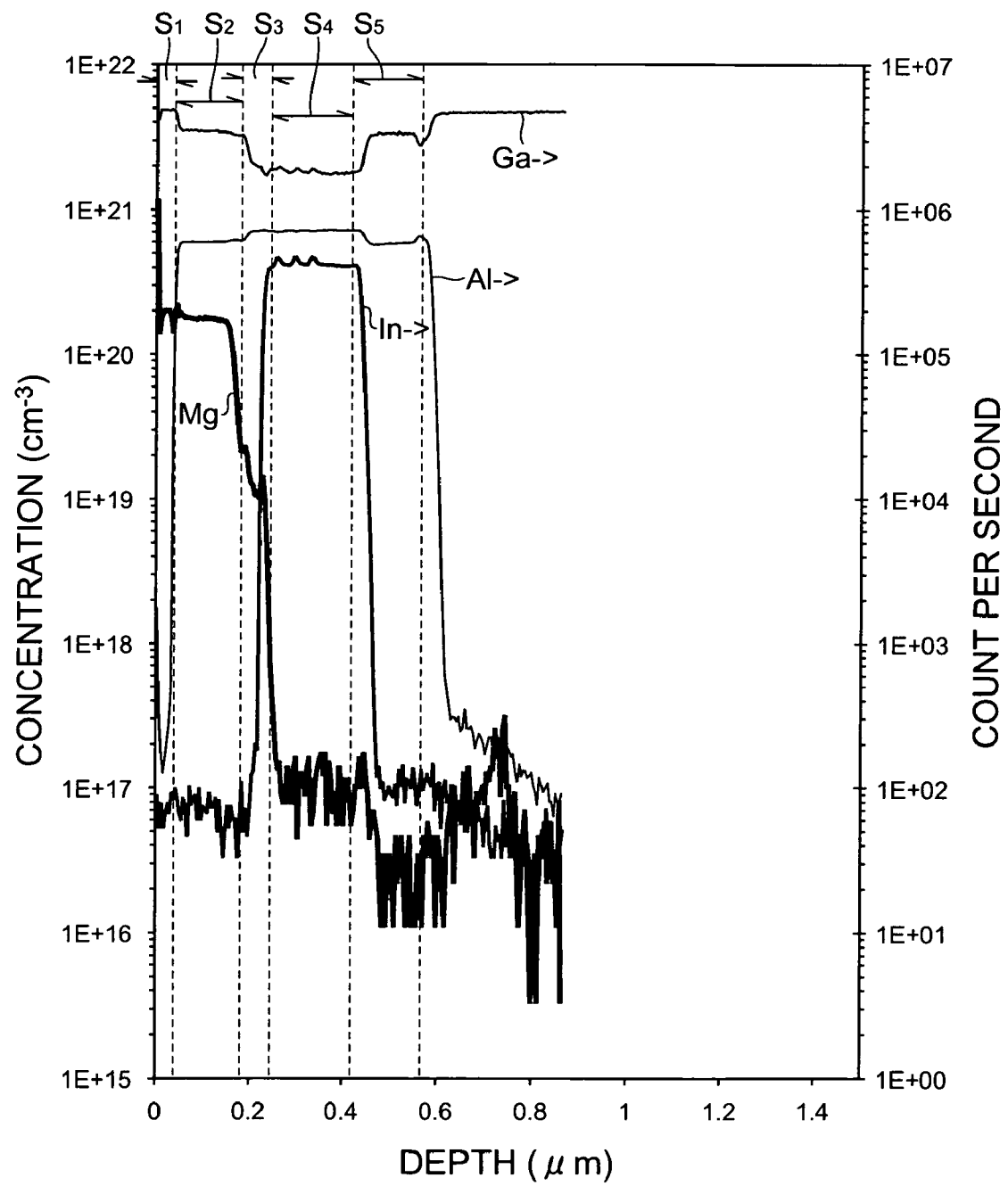
FIG. 6 is a graph showing a secondary ion mass spectroscopy (SIMS) analysis of light emitting diode A.
Figure 7:
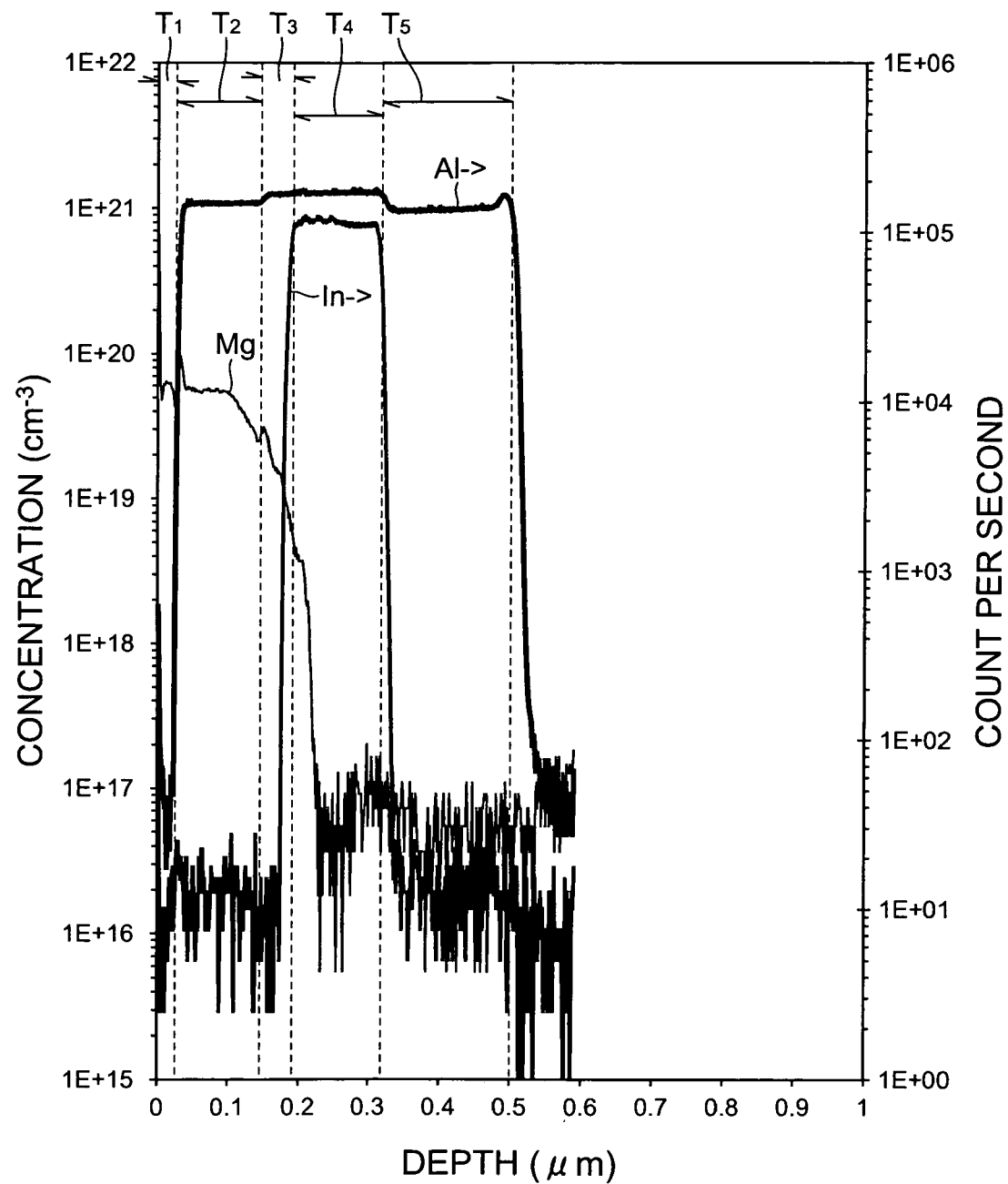
FIG. 7 is a graph showing a secondary ion mass spectroscopy (SIMS) analysis of light emitting diode B.

FIG. 6 shows secondary ion mass spectroscopy (SIMS) analysis of light emitting diode A. FIG. 7 shows secondary ion mass spectroscopy (SIMS) analysis for light emitting diode B. In FIGS. 6 and 7, lines Al, In, Ga and Mg indicate aluminum, indium, gallium and magnesium dopant profiles, respectively. The horizontal axis in each of FIGS. 6 and 7 indicates a depth from the surface of the light emitting diode. In each figure, the contact layer, the first AlGaN semiconductor layer, the second AlGaN semiconductor layer, the light generating region of InAlGaN semiconductor (containing three well layers and four barrier layers), the third AlGaN semiconductor layer, the buffer layer and GaN substrate are sequentially arranged along the horizontal axis from the origin to the positive direction. The vertical axis in each figure indicates the concentrations (or atom counts per second) of the main constituents (Al, In, Ga, Mg).

With reference to FIG. 6, line Mg indicates the following: the concentration of the magnesium dopant is greater than $1 \times 10^{20}$ cm$^{-3}$ in the first AlGaN layer and the dopant profile is rapidly decreased outside the first and second AlGaN layers, so that the concentration of the magnesium dopant at the interface between the second AlGaN layer and the light generating region is sufficient low, for example, $1 \times 10^{18}$ cm$^{-3}$.

In FIG. 6, regions S1, S2, S3, S4 and S5 correspond to the contact layer, the first AlGaN layer, the second AlGaN layer, the light generating region and the third AlGaN layer, respectively.

With reference to FIG. 7, line Mg indicates the following: the concentration of the magnesium dopant is greater than $1\times10^{19}$ cm$^{-3}$ in the first AlGaN layer and the dopant profile is gentle decline in the second AlGaN layer, so that the concentration of the magnesium dopant at the interface between the second AlGaN layer and the light generating region is not sufficiently low, for example, $3\times10^{18}$ cm$^{-3}$. The concentration of the magnesium dopant is further decreased in the light generating region and finally becomes sufficiently low value ($10^{17}$ cm$^{-3}$).

In FIG. 7, regions T1, T2, T3, T4 and T5 correspond to the contact layer, the first AlGaN layer, the second AlGaN layer, the light generating region and the third AlGaN layer, respectively.

Figure 8:
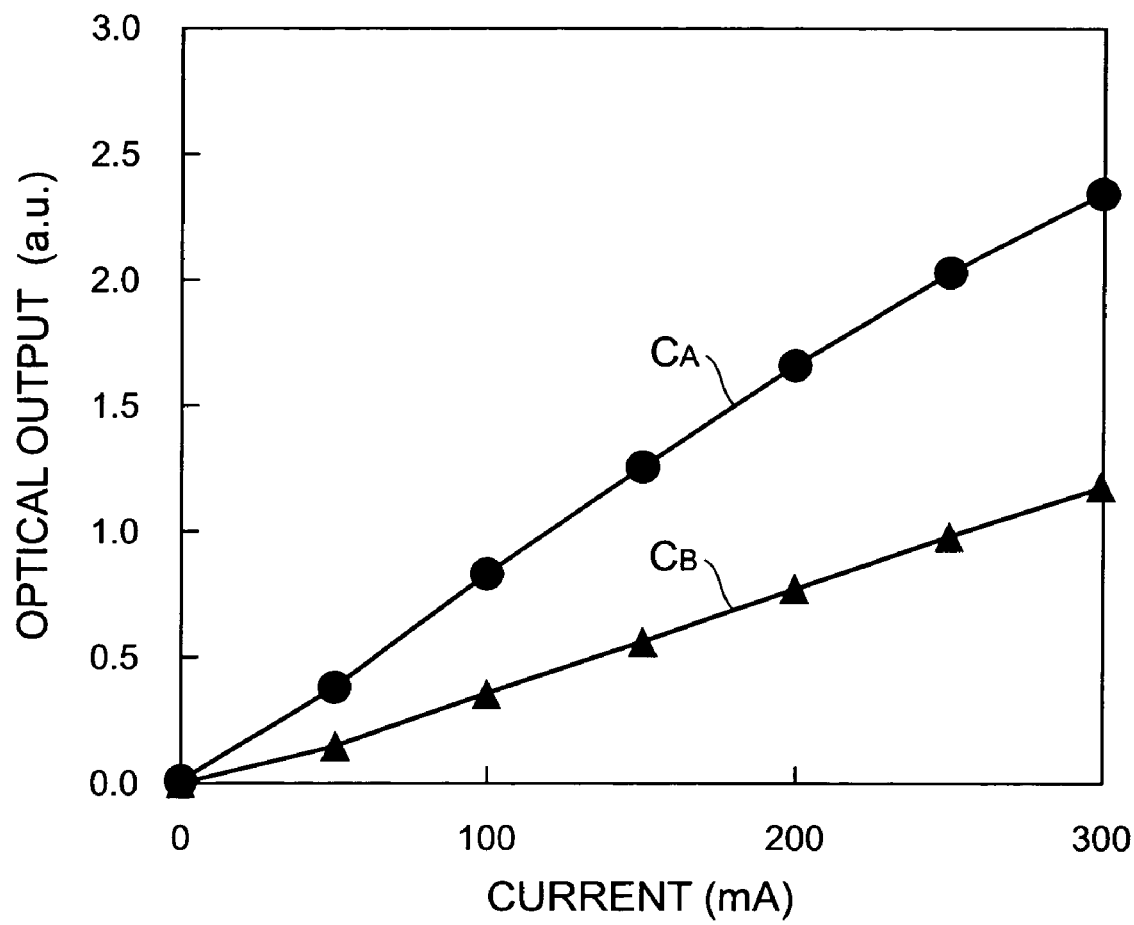
FIG. 8 is a graph showing optical powers of the light emitting diodes A and B.

FIG. 8 is a graph showing the characteristics of the above light emitting diodes. Line $C_A$ indicates the characteristics of light emitting diode A and Line $C_B$ indicates the characteristics of light emitting diode B. This graph reveals that the optical power of light emitting diode A is twice as large as that of light emitting diode B twice in the range up to 300 milliamperes.

The second AlGaN semiconductor layer in light emitting diode B is doped with Magnesium (Mg) and the second AlGaN semiconductor layer in light emitting diode A is undoped. The difference between the curves in FIG. 8 comes from the undoped second AlGaN semiconductor layer.

Figure 9:
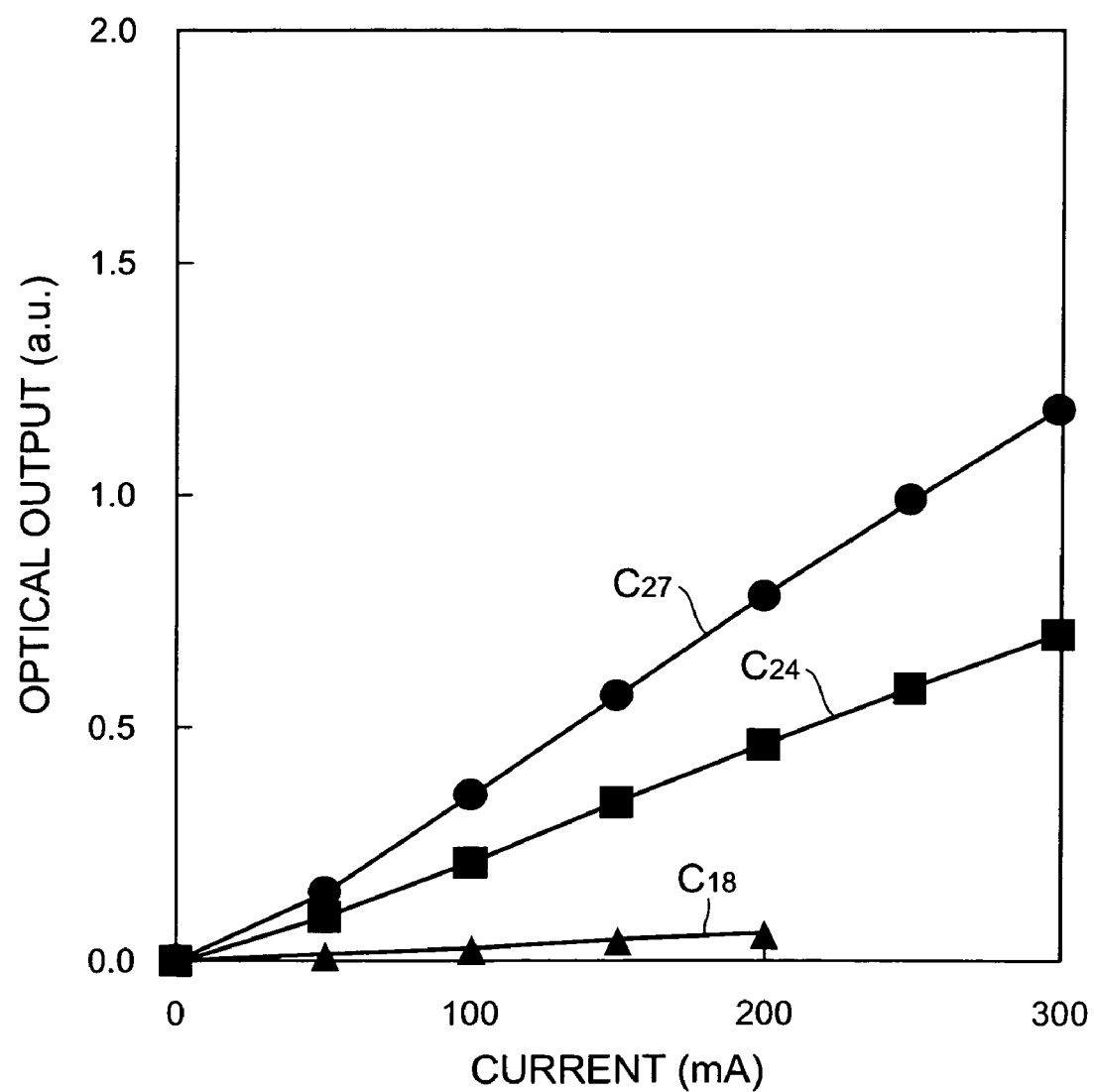
FIG. 9 is a graph showing optical powers of light emitting diodes.

FIG. 9 is a graph showing optical outputs of three light emitting diodes. Symbols C18, C24 and C27 indicate the characteristic curves of aluminum compositions (X), 0.18, 0.24 and 0.27 of the second $Al_xGa_{1-x}N$ layer, respectively. As shown in FIG. 9, the optical power is enhanced as the aluminum composition of the second AlGaN layer is large. The optical power is maximized at the composition of 27 percent and then is decreased in the aluminum composition over 27 percent.

Although the p-type dopant profile of the second AlGaN layer and the light generating region in the modified semiconductor light generating device 1b may be the same or similar to that shown in area (B) in FIG. 2, the p-type dopant profile in the modified semiconductor light generating device 1b is not limited thereto.

It is preferable that the aluminum composition of the $Al_xGa_{1-x}N$ cladding layer for the light generating region including one or more InAlGaN layers is greater than 0.1 (0.1<X), and more preferably, the aluminum composition is less than or equal to 0.3 (X≦0.3).

As explained above, the light generating semiconductor device including InAlGaN semiconductor according to the present embodiment improves the light generating efficiency thereof.

Second Embodiment

Areas (A) and (B) in FIGS. 10 and areas (A) and (B) in FIG. 11 show steps of fabricating the light generating semiconductor device according to the present embodiment.

As shown in area (A) in FIG. 10, a substrate 41, such as n-type GaN semiconductor single crystal substrate is prepared. Then, a number of semiconductor films of III group nitride are formed on the substrate using a metal-organic vapor phase epitaxy apparatus.

As shown in area (A) in FIG. 10, the substrate 41 is mounted on the susceptor 43a in the metal-organic vapor phase epitaxy apparatus 43. After adjusting the growth temperature, raw material gases are supplied to the evacuated vessel in the metal-organic vapor phase epitaxy apparatus 43 to form a film on the substrate 41. For example, the following raw material gases are used: trimethyl-gallium as a gallium source, trimethyl-aluminum as an aluminum source, trimethyl-indium adduct as an indium source, ammonia as a nitrogen source, tetraethyl silane as a silicon source, and bisethyl-cyclopentadienyl magnesium as a magnesium source.

The growth temperature is set at 1050 Celsius degrees. Tetraethyl silane, trimethyl-gallium and ammonia gases are supplied to the vessel to form an n-type GaN film 45 on the substrate 41. The GaN film 45 is used as a buffer layer. The thickness is, for example, 0.1 micrometers and the dopant concentration is, for example, about $2\times10^{18}$ cm$^{-3}$.

The temperature is kept unchanged and trimethyl-aluminum, tetraethyl silane, trimethyl-gallium and ammonia gases are supplied to the vessel to form an n-type AlGaN film 47 on the GaN film 45. The n-type AlGaN film 47 is used as a hole block layer. The thickness is, for example, 0.2 micrometers, its composition is, for example, $Al_{0.18}Ga_{0.82}N$ and the dopant concentration is, for example, about $2\times10^{18}$ cm$^{-3}$.

As shown in area (B) in FIG. 10, a light generating region 49 is then formed on the AlGaN film 47. The light generating region 49 includes an undoped InAlGaN semiconductor film. The growth temperature is set at 830 Celsius degrees. Trimethyl-aluminum, trimethyl-indium adduct, trimethyl-gallium and ammonia gases are supplied to the vessel to form an $In_{0.05}Al_{0.25}Ga_{0.70}N$ film on the n-type AlGaN film 47. The composition of this film is determined using Rutherford Back Scattering Method. This InAlGaN film is used as a barrier layer and the thickness is, for example, 15 nanometers.

Then, trimethyl-aluminum, trimethyl-indium adduct, trimethyl-gallium and ammonia gases are supplied to the vessel to form an $In_{0.05}Al_{0.25}Ga_{0.75}N$ film on the n-type AlGaN film 47. This InAlGaN film is used as a well layer and the thickness is, for example, 3 nanometers. Subsequently, trimethyl-aluminum, trimethyl-indium adduct, trimethyl-gallium and ammonia gases are supplied to the vessel to form an $In_{0.05}Al_{0.25}Ga_{0.70}N$ film on the n-type AlGaN film 47. The InAlGaN film is used as a barrier layer and the thickness is, for example, 15 nanometers. The well layer and the barrier layer is repeatedly deposited until desired light generating region is formed, for example, three times. The repetition forms the light generating region having a multiple quantum well structure.

One example of an InAlGaN barrier layer is:
ammonia: 2 litters per minute
trimethyl-gallium: 1.5 micromoles per minute
trimethyl-aluminum: 0.65 micromoles per minute
trimethyl-indium adduct: 30 micromoles per minute.
One example of an InAlGaN well layer is:

ammonia: 2 litters per minute trimethyl-gallium: 1.5 micromoles per minute trimethyl-aluminum: 0.52 micromoles per minute trimethyl-indium adduct: 53 micromoles per minute.

In area (A) in FIG. 11, the growth temperature is set at 1050 Celsius degrees. An undoped $Al_{X2}Ga_{1-X2}N$ semiconductor film (0≦X2≦1) is formed on the light generating region 49 including InAlGaN semiconductor film. For example, trimethyl-gallium, trimethyl-aluminum and ammonia gases are supplied to the vessel to form an undoped AlGaN film 51 on the light generating region 49. This AlGaN film 51 is used as an electron block layer. Its thickness is, for example, 20 nanometers and its composition is, for example, $Al_{0.27}Ga_{0.73}N$.

Subsequently, the temperature is kept unchanged and a p-type $Al_{X1}Ga_{1-X1}N$ semiconductor ($0 \leq X1 \leq 1$) film 53 and one or more GaN-based semiconductor film, such as a contact film 55, are formed on the undoped AlGaN film 51. During the deposition of these films, p-type dopant atoms in the $Al_{X1}Ga_{1-X1}N$ semiconductor film 53 diffuse into the undoped AlGaN film 51, and the undoped AlGaN film 51 reduces the number of p-type dopant atoms diffusing from the $Al_{X1}Ga_{1-X1}N$ semiconductor film 53 to the light generating region 49. Most part of the light generating region 49 does not contain the p-type dopant atoms from the $Al_{X1}Ga_{1-X1}N$ semiconductor film 53 and thus is substantially undoped.

Trimethyl-aluminum, bisethyl-cyclopentadienyl-magnesium trimethyl-gallium and ammonia gases are supplied to the vessel to form a p-type AlGaN film 53 on the undoped AlGaN film 51, the p-type AlGaN film 53 is used as an electron block layer. Its thickness is, for example, 50 nanometers, its composition is, for example, $Al_{0.18}Ga_{0.82}N$, and its dopant concentration is, for example, about $2 \times 10^{20}$ cm$^{-3}$.

In area (B) in FIG. 11, bisethyl-cyclopentadienyl magnesium, trimethyl-gallium, ammonia is supplied to deposit a p-type GaN layer is formed on the p-type GaN layer 55 on the p-type AlGaN semiconductor layer 53. The p-type GaN film 55 works as a p-type contact layer, its thickness is, for example, 50 nanometers, and its dopant concentration is about $2 \times 10^{20}$ cm$^{-3}$.

After the above steps, a number of GaN-based semiconductor films are deposited on the substrate to form a substrate production. Then, a semi-transparent electrode (anode electrode) is formed on the contact film 55 and another electrode (cathode electrode) is formed on the backside of the substrate 41.

As explained above, a method of fabricating a semiconductor light generating device including InAlGaN semiconductor is provided.

Since the growth temperatures for AlGaN semiconductor and GaN semiconductor is higher than the growth temperature for InAlGaN semiconductor, it is not likely to form pits on AlGaN semiconductor and GaN semiconductor but it is likely to form more pits on InAlGaN semiconductor as compared to AlGaN semiconductor and GaN semiconductor. InAlGaN semiconductor containing many pits facilitates to diffuse p-type dopant magnesium atoms therein and thus the light generating efficiency is deteriorated. In the semiconductor light generating device as explained above, the effect of the p-type dopant magnesium atoms is reduced. Since the temperature favorable for growing InAlGaN semiconductor is lower than temperatures for AlGaN semiconductor and GaN semiconductor, it is likely to form more pits on InAlGaN semiconductor as compared to AlGaN semiconductor and GaN semiconductor. By reducing the quantity of p-type dopant magnesium atoms in the InAlGaN layers and by doping the AlGaN layer adjacent to the InAlGaN layers with p-type dopant magnesium atoms by diffusion to lower the resistance of the semiconductor light generating device, the semiconductor light generating device including InAlGaN semiconductor layers prevents the light generating efficiency from decreasing.

Having described and illustrated the principle of the invention in a preferred embodiment thereof, it is appreciated by those having skill in the art that the invention can be modified in arrangement and detail without departing from such principles. For example, the present embodiments have explained the semiconductor surface emitting devices, such as light emitting diodes, but those having skill in the art appreciates the present invention can be used for laser diodes. The present invention is not limited to the specific examples disclosed in the specification. Details of structures of these devices can be modified as necessary. Further, sapphire substrates can be used as a supporting body. We therefore claim all modifications and variations coming within the spirit and scope of the following claims.

What is claimed is:

1. A semiconductor light generating device comprising:
    a light generating region including an InAlGaN semiconductor well layer and an InAlGaN semiconductor barrier layer;
    a first $Al_{X1}Ga_{1-X1}N$ semiconductor layer ($0 \leq X1 \leq 1$) doped with p-type dopant; and
    a second $Al_{X2}Ga_{1-X2}N$ semiconductor layer ($0 \leq X2 \leq 1$) having a p-type dopant concentration smaller than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer, and
    wherein the second $Al_{X2}Ga_{1-X2}N$ semiconductor layer is in contact with the light generating region.

2. The semiconductor light generating device according to claim 1, wherein thickness of the second $Al_{X2}Ga_{1-X2}N$ semiconductor layer is greater than or equal to five nanometers.

3. The semiconductor light generating device according to claim 1, wherein the first $Al_{X1}Ga_{1-X1}N$ semiconductor layer is doped with magnesium of p-type dopant, and
    wherein the first $Al_{X1}Ga_{1-X1}N$ semiconductor layer includes a region having a magnesium concentration of $1 \times 10^{19}$ cm$^{-3}$ or higher.

4. The semiconductor light generating device according to claim 1, further comprising:
    a supporting body of III-group nitride, the light generating region, the first $Al_{X1}Ga_{1-X1}N$ semiconductor layer and the second $Al_{X2}Ga_{1-X2}N$ semiconductor layer being provided on the supporting body.

5. The semiconductor light generating device according to claim 1, wherein the second $Al_{X2}Ga_{1-X2}N$ semiconductor layer has an aluminum composition greater than that of the first $Al_{X1}Ga_{1-X1}N$ semiconductor layer.

6. The semiconductor light generating device according to claim 1, wherein the light generating region further includes one or more InAlGaN semiconductor barrier layers and one or more InAlGaN semiconductor well layers.

7. The semiconductor light generating device according to claim 1, further comprising a contact layer covering the first $Al_{X1}Ga_{1-X1}N$ semiconductor layer, said contact layer comprising a p-type GaN-based semiconductor layer.

8. The semiconductor light generating device according to claim 1, wherein a p-type dopant concentration at an interface between the first $Al_{X1}Ga_{1-X1}N$ semiconductor layer and the second $Al_{X2}Ga_{1-X2}N$ semiconductor layer is greater than a p-type dopant concentration at an interface between the light generating region and the second $Al_{X2}Ga_{1-X2}N$ semiconductor layer.

9. The semiconductor light generating device according to claim 8, wherein the second $Al_{X2}Ga_{1-X2}N$ semiconductor layer includes a p-type dopant concentration profile that monotonically decreases from the interface with the first $Al_{X1}Ga_{1-X1}N$ semiconductor layer to the interface with the light generating region.

10. A semiconductor light generating device comprising:
    a light generating region including an InAlGaN semiconductor layer;
    a first $Al_{X1}Ga_{1-X1}N$ semiconductor layer ($0 \leq X1 \leq 1$) doped with p-type dopant;

a second $Al_{X2}Ga_{1-X2}N$ semiconductor layer ($0 \leq X2 \leq 1$) having a p-type dopant concentration smaller than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer, wherein the second $Al_{X2}Ga_{1-X2}N$ semiconductor layer is doped with magnesium dopant, and wherein a p-type dopant concentration at an interface between the light generating region and the second $Al_{X2}Ga_{1-X2}N$ semiconductor layer is less than $3 \times 10^{18}$ cm$^{-3}$ or lower.

11. A semiconductor light generating device comprising:
a light generating region including an InAlGaN semiconductor layer;
a first $Al_{X1}Ga_{1-X1}N$ semiconductor layer ($0 \leq X1 \leq 1$) doped with p-type dopant; and
a second $Al_{X2}Ga_{1-X2}N$ semiconductor layer ($0 \leq X2 \leq 1$) having a p-type dopant concentration smaller than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer,
wherein a maximum concentration of p-type dopant in the first $Al_{X1}Ga_{1-X1}N$ semiconductor layer is not less than $1 \times 10^{20}$ cm$^{-3}$,
wherein a p-type dopant concentration at an interface between the light generating region and the second $Al_{X2}Ga_{1-X2}N$ semiconductor layer is not greater than $3 \times 10^{18}$ cm$^{-3}$.

12. A semiconductor light generating device comprising:
a light generating region including an InAlGaN semiconductor layer;
a first $Al_{X1}Ga_{1-X1}N$ semiconductor layer ($0<X1 \leq 1$) doped with p-type dopant; and
a second $Al_{X2}Ga_{1-X2}N$ semiconductor layer ($0<X2 \leq 1$) having a p-type dopant concentration smaller than that of the first $Al_{X1}Ga_{1-X1}N$ semiconductor layer, the second $Al_{X2}Ga_{1-X2}N$ semiconductor layer being provided between the InAlGaN semiconductor layer and the first $Al_{X1}Ga_{1-X1}N$ semiconductor layer, and
wherein the second $Al_{X2}Ga_{1-X2}N$ semiconductor layer is in contact with the light generating region.

13. The semiconductor light generating device according to claim 12, wherein the second $Al_{X2}Ga_{1-X2}N$ semiconductor layer ($0 \leq X2 \leq 1$) has an aluminum composition greater than that of the first $Al_{X1}Ga_{1-X1}N$ semiconductor layer.

14. The semiconductor light generating device according to claim 13, wherein the second $Al_{X2}Ga_{1-X2}N$ semiconductor layer includes a region having a p-type concentration of $3 \times 10^{18}$ cm$^{-3}$ or lower, and
wherein this region is 1 nanometer or more.

15. The semiconductor light generating device according to claim 13, wherein the first $Al_{X1}Ga_{1-X1}N$ semiconductor layer is doped with magnesium of p-type dopant, and wherein the first $Al_{X1}Ga_{1-X1}N$ semiconductor layer includes a region having a magnesium concentration of $1 \times 10^{19}$ cm$^{-3}$ or higher.

16. The semiconductor light generating device according to claim 13, wherein the second $Al_{X2}Ga_{1-X2}N$ semiconductor layer is doped with magnesium dopant, and wherein a p-type dopant concentration at an interface between the light generating region and the second $Al_{X2}Ga_{1-X2}N$ semiconductor layer is less than $3 \times 10^{18}$ cm$^{-3}$ or lower.

17. The semiconductor light generating device according to claim 13, wherein a maximum concentration of p-type dopant in the first $Al_{X1}Ga_{1-X1}N$ semiconductor layer is not less than $1 \times 10^{20}$ cm$^{-3}$, wherein a p-type dopant concentration at an interface between the light generating region and the second $Al_{X2}Ga_{1-X2}N$ semiconductor layer is not greater than $3 \times 10^{18}$ cm$^{-3}$.

18. The semiconductor light generating device according to claim 13, further comprising:
a supporting body of III-group nitride, the light generating region, the first $Al_{X1}Ga_{1-X1}N$ semiconductor layer and the second $Al_{X2}Ga_{1-X2}N$ semiconductor layer being provided on the supporting body.

19. The semiconductor light generating device according to claim 13, wherein the second $Al_{X2}Ga_{1-X2}N$ semiconductor layer is formed as an undoped layer.

20. The semiconductor light generating device according to claim 13, wherein the light generating region further includes one or more InAlGaN semiconductor barrier layers and one or more InAlGaN semiconductor well layers.

21. The semiconductor light generating device according to claim 12, further comprising a contact layer covering the first $Al_{X1}Ga_{1-X1}N$ semiconductor layer, said contact layer comprising a p-type GaN-based semiconductor layer.

22. The semiconductor light generating device according to claim 12, wherein a p-type dopant concentration at an interface between the first $Al_{X1}Ga_{1-X1}N$ semiconductor layer and the second $Al_{X2}Ga_{1-X2}N$ semiconductor layer is greater than a p-type dopant concentration at an interface between the light generating region and the second $Al_{X2}Ga_{1-X2}N$ semiconductor layer.

23. The semiconductor light generating device according to claim 22, wherein the second $Al_{X2}Ga_{1-X2}N$ semiconductor layer includes a p-type dopant concentration profile that monotonically decreases from the interface with the first $Al_{X1}Ga_{1-X1}N$ semiconductor layer to the interface with the light generating region.

* * * * *